(12) United States Patent
Miyake et al.

(10) Patent No.: US 10,739,425 B2
(45) Date of Patent: Aug. 11, 2020

(54) RF COIL APPARATUS AND MAGNETIC RESONANCE IMAGING APPARATUS

(71) Applicant: Canon Medical Systems Corporation, Otawara-shi (JP)

(72) Inventors: Hisao Miyake, Nagoya (JP); Yuji Takano, Tokyo (JP)

(73) Assignee: Canon Medical Systems Corporation, Otawara-shi (JP)

(*) Notice: Subject to any disclaimer, the term of this patent is extended or adjusted under 35 U.S.C. 154(b) by 149 days.

(21) Appl. No.: 16/130,303

(22) Filed: Sep. 13, 2018

(65) Prior Publication Data

US 2019/0086492 A1 Mar. 21, 2019

(30) Foreign Application Priority Data

Sep. 19, 2017 (JP) .................. 2017-178891

(51) Int. Cl.
*G01R 33/36* (2006.01)
*G01R 33/34* (2006.01)
*G01R 33/385* (2006.01)
*G01R 33/3415* (2006.01)

(52) U.S. Cl.
CPC ..... *G01R 33/3635* (2013.01); *G01R 33/3415* (2013.01); *G01R 33/34092* (2013.01); *G01R 33/3621* (2013.01); *G01R 33/3664* (2013.01); *G01R 33/385* (2013.01)

(58) Field of Classification Search
CPC ............ G01R 33/3621; G01R 33/3415; G01R 33/3628; G01R 33/36
See application file for complete search history.

(56) References Cited

U.S. PATENT DOCUMENTS

2014/0361775 A1* 12/2014 Qiu .................... G01R 33/3664
324/309
2017/0322267 A1* 11/2017 Biber ................. G01R 33/3621

* cited by examiner

*Primary Examiner* — Alesa Allgood
(74) *Attorney, Agent, or Firm* — Oblon, McClelland, Maier & Neustadt, L.L.P.

(57) ABSTRACT

According to one embodiment, an RF coil apparatus includes coil elements and multiplexing circuitry. The coil elements each receive magnetic resonance signals. The multiplexing circuitry multiplexes the magnetic resonance signals received respectively by the coil elements, by using a local signal. The multiplexing circuitry includes mixer circuitry and matching circuitry. The mixer circuitry has a local port for inputting the local signal that includes a local frequency. The mixer circuitry converts at least one frequency among the magnetic resonance signals in accordance with the local frequency of the local signal input via the local port. The matching circuitry matches, in a narrow band, a local signal that is to be input to the local port with the local frequency.

13 Claims, 7 Drawing Sheets

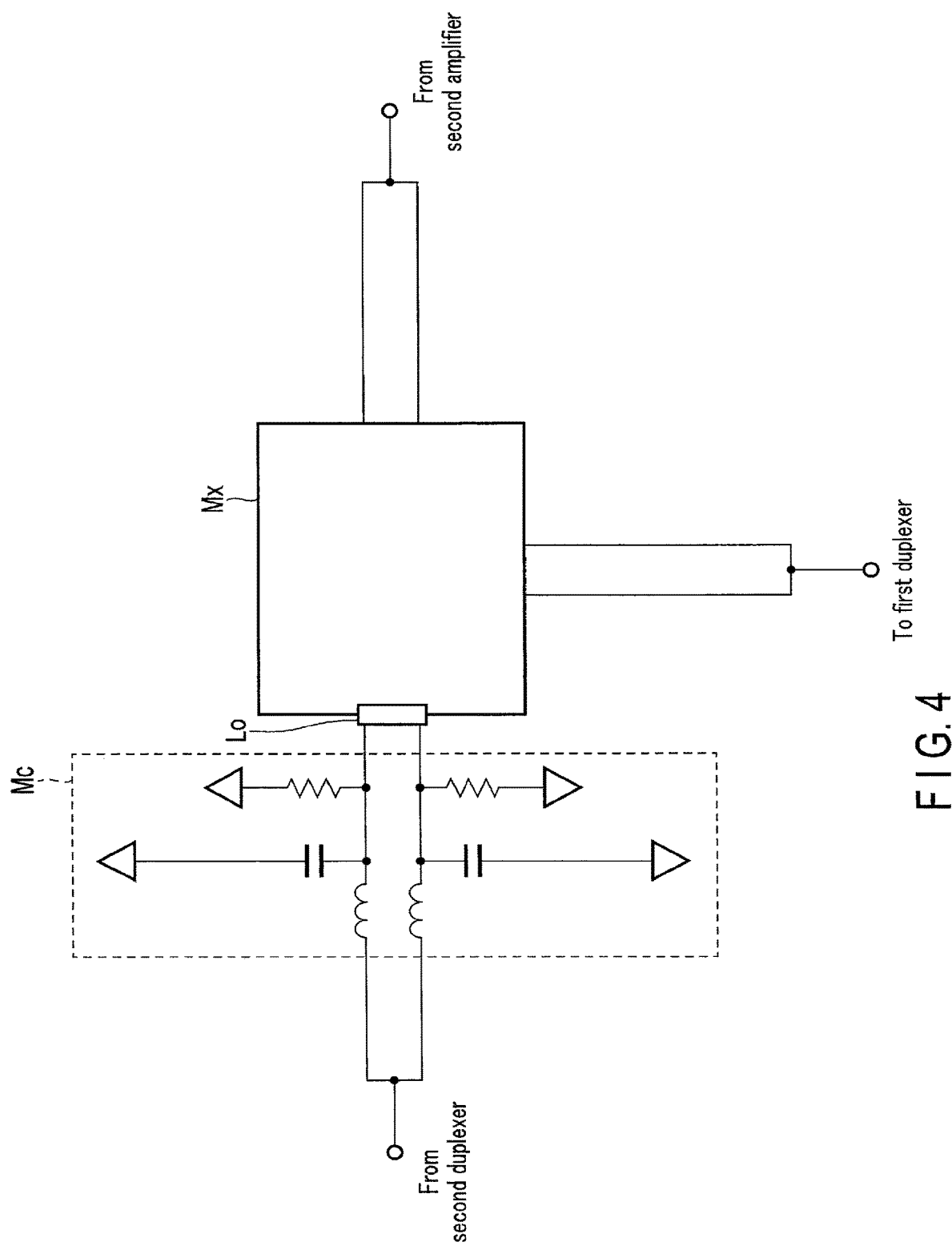
F I G. 4

RF COIL APPARATUS AND MAGNETIC RESONANCE IMAGING APPARATUS

CROSS-REFERENCE TO RELATED APPLICATIONS

This application is based upon and claims the benefit of priority from the prior Japanese Patent Application No. 2017-178891, filed Sep. 19, 2017, the entire contents of which are incorporated herein by reference.

FIELD

Embodiments described herein relate generally to an RF coil apparatus and a magnetic resonance imaging apparatus.

BACKGROUND

In a magnetic resonance imaging apparatus, a radio frequency (RF) coil apparatus serving as a reception coil that comes into contact with a subject is required to have low heat emission to preserve the safety of the subject. In the RF coil apparatus including a plurality of coil elements, in some cases, a plurality of magnetic resonance signals corresponding to the plurality of coil elements are multiplexed, that is, combined, and output to reception circuitry via one coaxial connector. Herewith, the RF coil apparatus executes frequency conversion with respect to the magnetic resonance signals. The frequency conversion is executed in mixer circuitry within the RF coil apparatus. An input power of a local signal input to the mixer circuitry by wide-band matching is required to reach, for example, +10 dBm. Therefore, in some cases, heat may be generated by the local signal at the RF coil apparatus that multiplexes the resonance signals.

BRIEF DESCRIPTIONS OF THE DRAWINGS

FIG. 4 shows an example of a circuitry configuration of first narrow-band matching circuitry and first mixer circuitry according to the present embodiment.

DETAILED DESCRIPTION

According to the present embodiment, an RF coil apparatus includes a plurality of coil elements and multiplexing circuitry. The plurality of coil elements each receive a plurality of magnetic resonance signals. The multiplexing circuitry multiplexes the plurality of magnetic resonance signals received respectively by the plurality of coil elements, by using a local signal. The multiplexing circuitry includes mixer circuitry and matching circuitry. The mixer circuitry has a local port for inputting the local signal that includes a local frequency. The mixer circuitry converts at least one frequency among the plurality of magnetic resonance signals in accordance with the local frequency of the local signal input via the local port. The matching circuitry matches, in a narrow band, a local signal that is to be input to the local port with the local frequency.

The purpose is to reduce heat generation at the RF coil apparatus.

In the following, a magnetic resonance imaging apparatus (hereinafter referred to as an MRI apparatus) according to the embodiment will be explained with reference to the drawings. In the explanation below, structural elements having substantially the same functions and configurations will be denoted by the same reference symbols, and a repetitive explanation thereof will be provided only when necessary.

Figure 1:
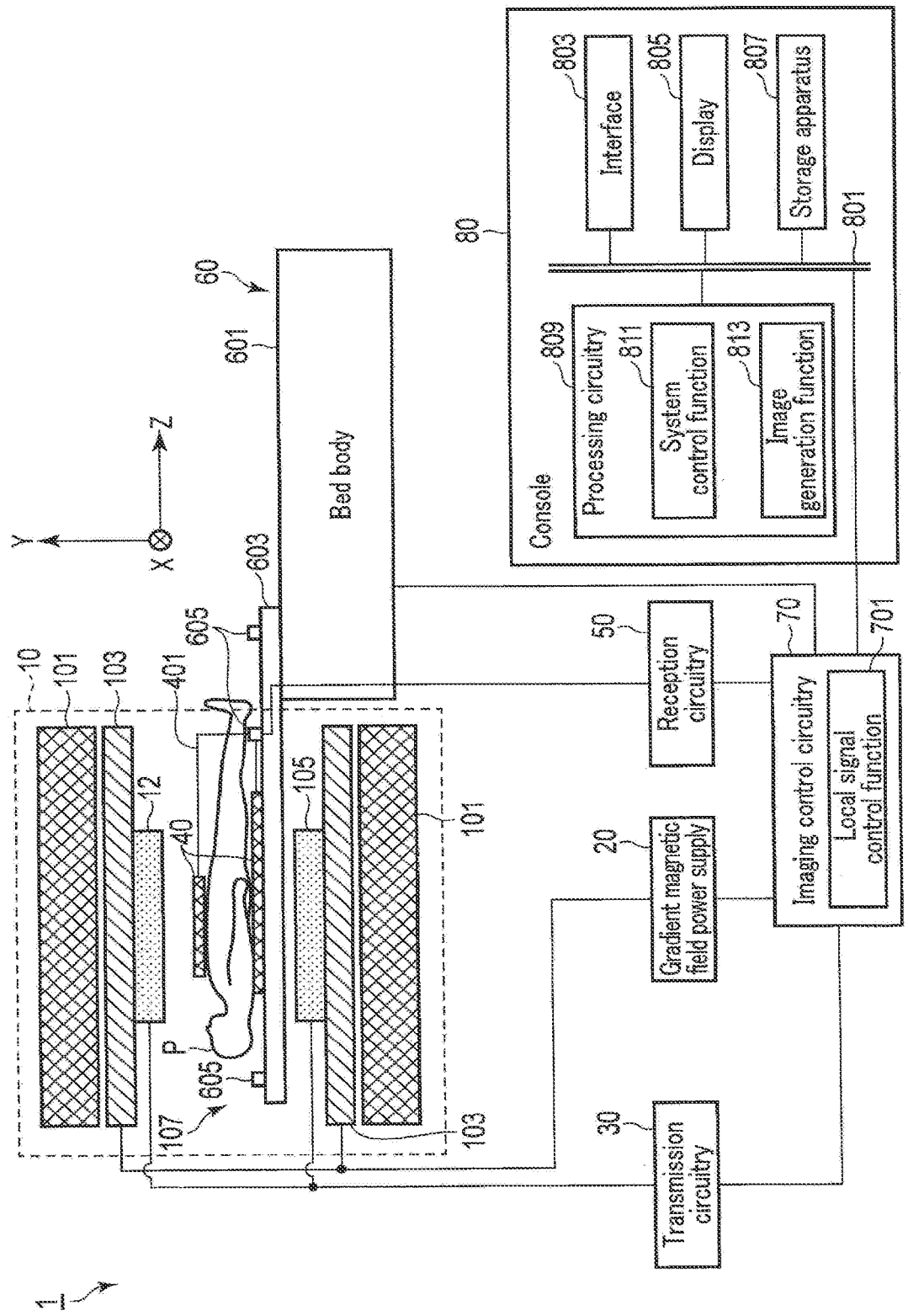
FIG. 1 shows a configuration of a magnetic resonance imaging apparatus according to a present embodiment.

An overall configuration of an MRI apparatus 1 of the present embodiment will be explained with reference to FIG. 1. FIG. 1 shows a configuration of the MRI apparatus 1 of the present embodiment. As shown in FIG. 1, the MRI apparatus 1 comprises a gantry 10, a gradient magnetic field power supply 20, transmission circuitry (transmitter) 30, an RF coil apparatus 40, reception circuit (receiver) 50, a bed apparatus 60, imaging control circuitry (imaging controller) 70, and a console 80.

The gantry 10 includes a static field magnet 101, a gradient coil 103, and a transmission coil 105. The gantry 10 may also have a hollow cylindrical shim coil provided between the static field magnet 101 and the gradient coil 103. The gantry 10 is installed in an examination room.

The static field magnet 101 is a magnet in hollow form and substantially cylindrical. The static field magnet 101 is not limited to a substantially cylindrical shape, and may be configured in an open shape. The static field magnet 101 generates a uniform static magnetic field in a space therein. As the static field magnet 101, for example, a superconductive magnet is used.

The gradient coil 103 is a coil in hollow form and cylindrical. The gradient coil 103 is arranged on the inner side of the static field magnet 101. The gradient coil 103 is formed by combining three coils respectively corresponding to X-, Y-, and Z-axes which are orthogonal to each other. A Z-axis direction is a direction that is identical to the direction of the static magnetic field. In addition, a Y-axis direction is a vertical direction, and an X-axis direction is a direction perpendicular to each of the Z-axis and the Y-axis. The three coils in the gradient coil 103 are separately supplied with a current from the gradient magnetic field power supply 20 and respectively generate gradient magnetic fields in which magnetic field intensity changes along each of the X-, Y-, and Z-axes.

The gradient magnetic fields regarding each of the X-, Y-, and Z-axes generated by the gradient coil 103 each correspond to, for example, a gradient magnetic field for frequency encoding (also referred to as a readout gradient magnetic field) $G_r$, a gradient magnetic field for phase encoding $G_\varphi$, and a gradient magnetic field for slice selection $G_s$. The gradient magnetic field for slice selection $G_s$ is used to determine an appropriate imaging cross-section. The gradient magnetic field for phase encoding $G_\varphi$ is used to change phases of magnetic resonance (hereinafter referred to as MR) signals in accordance with a spatial position. The gradient magnetic field for frequency encoding $G_r$ is used to change frequencies of the MR signals in accordance with a spatial position.

The transmission coil 105 is an RF coil that is arranged on the inner side of the gradient coil 103. The transmission coil 105 receives a radio frequency pulse (also referred to as an RF pulse) from the transmission circuitry 30 and generates a transmission RF wave that corresponds to a radio frequency magnetic field. The transmission coil 105 is, for example, a whole body coil (WB coil) that has a plurality of coil elements or one coil. The WB coil may be used as a transmission/reception coil.

The gradient magnetic field power supply 20 is a power source apparatus that is controlled by the imaging control circuitry 70 in order to supply a current to the gradient coil 103. In FIG. 1, the gradient field power supply 20 is illustrated outside the gantry 10; however, it may be mounted on the gantry 10, or installed in a control room different to the examination room where the gantry 10, etc. is installed. The control room is a shield room that is capable of shielding leakage magnetic field from the gantry 10 or electromagnetic field, etc. from outside.

The transmission circuitry 30 is controlled by the imaging control circuitry 70 to supply an RF pulse modulated with a Larmor frequency (also referred to as a resonance frequency) in accordance with a static magnetic field and a gradient magnetic field to the transmission coil 105. In FIG. 1, the transmission circuitry 30 is illustrated outside the gantry 10; however, it may be mounted on the gantry 10, or installed in the control room.

The RF coil apparatus 40 is mounted on a top plate 603. The RF coil apparatus 40 includes a local reception coil that corresponds to an imaging target portion of a subject P. The reception coil is, for example, a coil array having one or more, typically, a number of coil elements. In the following, in order to provide specific explanations, the RF coil apparatus 40 will be explained as having a plurality of coil elements that each receive a plurality of MR signals. The RF coil apparatus 40 is inserted into a bore 107 together with the top plate 603. The RF coil apparatus 40 is connected to a connection port (coaxial connector) 605 that is provided on the top plate 603 via a coaxial cable 401 through one coaxial connector.

At the RF coil apparatus 40, each of the plurality of coil elements receives an MR signal emitted from the subject P by the radio frequency magnetic field. The RF coil apparatus 40 multiplexes a plurality of MR signals received at each of the coil elements by using a local signal, to be explained later on. The RF coil apparatus 40 outputs the multiplexed MR signals to the reception circuitry 50. The RF coil apparatus 40 may also be operated as a transmission/reception coil apparatus. Here, when the RF coil apparatus 40 is supplied with an RF pulse from the transmit circuitry 30, each of the plurality of coil elements generates transmission RF waves. A specific configuration of the RF coil apparatus 40 will be explained later on.

The reception circuitry 50 is controlled by the imaging control circuitry 70 in order to generate MR data by digitizing the MR signals output from the RF coil apparatus 40. Specifically, the reception circuitry 50 divides the multiplexed MR signals into MR signals in accordance with the total number of coil elements. The reception circuitry 50 performs various types of signal processing, such as pre-amplification, intermediate-frequency conversion, phase detection, low-frequency amplification, and filtering with respect to the divided MR signals. The reception coil executes analog-to-digital (A/D) conversion with respect to the MR signals on which the various types of signal processing were performed. In this manner, the reception circuitry 50 generates the MR data. The reception circuitry 50 outputs the generated MR data to the imaging control circuitry 70. In FIG. 1, the reception circuitry 50 is illustrated outside the gantry 10; however, it may also be mounted on the gantry 10, or installed in the control room. The configuration of the reception circuitry 50 will be explained later on.

A bed apparatus 60 includes a bed body 601 and the top plate 603. The bed body 601 is controlled by the imaging control circuitry 70 to insert the top plate 603 into the bore 107. The bed body 601 is installed in the examination room so that, for example, a longitudinal direction of the bed body 601 becomes parallel to a center axis of the static field magnet 101. The bed body 601 is driven by an operator's instruction through an interface 803 to move the top plate 603 along each of the X-, Y-, and Z-axes. The subject P and the RF coil apparatus 40 are mounted on the top plate 603. The top plate 603 is provided with a plurality of connection ports 605 to be connected to the coaxial cable 401 that extends from the RF coil apparatus 40. Output lines from the connection ports 605 are connected to the reception circuitry 50 through the bed body 601.

The imaging control circuitry 70 includes a processor and a memory, etc. such as a Read-Only Memory (ROM) or a Random Access Memory (RAM) as hardware resource (not illustrated). The imaging control circuitry 70 controls the gradient magnetic field power supply 20, the transmission circuitry 30, the reception circuitry 50, and the bed apparatus 60, etc. in accordance with an imaging protocol output from processing circuitry 809, and images the subject P. The imaging protocol includes various types of pulse sequences in accordance with the examination. The imaging protocol defines the magnitude of a current to be supplied from the gradient magnetic field power supply 20 to the gradient coil 103, the timing at which the current is to be supplied from the gradient magnetic field power supply 20 to the gradient coil 103, the magnitude of an RF pulse to be supplied from the transmission circuitry 30 to each of the coil elements at the transmission coil 105 or the RF coil apparatus 40 and a time width, the timing at which the RF pulse is to be supplied from the transmission circuitry 30 to each of the coil elements at the transmission coil 105 or the RF coil apparatus 40, and the timing at which an MR signal is to be received by each of the coil elements at the RF coil apparatus 40, etc. In FIG. 1, the imaging control circuitry 70 is illustrated outside the gantry 10; however, it may be mounted on the gantry 10, or installed in the control room. A local signal control function 701 in the imaging control circuitry 70 will be explained later on in an applied example.

The console 80 includes a bus 801, an interface (input unit) 803, a display (display unit) 805, a storage apparatus 807, and processing circuitry (processing unit) 809. The console 80 is installed in the control room.

The bus 801 is a transmission path that transmits data among the interface 803, the display 805, the storage apparatus 807, and the processing circuitry 809. The bus 801 may be connected to various types of biosignal measurement equipment, external storage apparatuses, and various types of modalities, etc. as appropriate through a network, etc.

The interface 803 includes circuitry receiving various instructions and information inputs from the operator. The interface 803 includes circuitry regarding, for example, a pointing device, such as a mouse, or an input device, such as a keyboard. The circuitry including the interface 803 is not limited to the kind provided with physical operating parts such as a mouse and a keyboard. For example, the interface 803 may include processing circuitry of an electrical signal that receives an electrical signal corresponding to an input operation from an external input device provided separately from the MRI apparatus 1, and outputs the received electrical signal to various circuits.

The display 805 is controlled by a system control function 811 in the processing circuitry 809 to display various MR images generated by an image generation function 813 and various information etc. regarding imaging and image processing. The display 805 is, for example, a display device, such as a CRT display, a liquid crystal display, an organic EL display, an LED display, a plasma display, or any other display known in this technical field, or a monitor.

The storage apparatus 807 stores MR data filled in space k by the image generation function 813, and data of an MR image generated by the image generation function 813, etc. The storage apparatus 807 stores imaging conditions, etc. including various imaging protocols and a plurality of imaging parameters that define the imaging protocols. The storage apparatus 807 stores programs corresponding to each function executed by the processing circuitry 809. The storage apparatus 807 may be realized by, for example, a semiconductor memory element, such as a RAM and a flash memory, a hard disk drive, a solid state drive, and an optical disk. The storage apparatus 807 may also be a driving device, etc. that reads and writes various information to and from portable storage media, such as a CD-ROM drive, a DVD drive, and a flash memory.

The processing circuitry 809 includes an unillustrated processor, and a memory, such as a ROM or a RAM, as hardware resources, to control the MRI apparatus 1 comprehensively. The processing circuitry 809 includes various types of functions, such as the system control function 811 and the image generation function 813. The various types of functions performed at the system control function 811 and the image generation function 813 are stored in the storage apparatus 807 in the form of a program that is executable by a computer. The processing circuitry 809 is a processor that realizes a function that corresponds to each program by reading a program that corresponds to each of these functions from the storage apparatus 807 and executing it. In other words, the processing circuitry 809 in a state where each of the programs is read includes the plurality of the functions, etc. presented in the processing circuitry 809 of FIG. 1.

In FIG. 1, these functions are explained as being realized in single processing circuitry 809; however, the functions may also be realized by combining a plurality of independent processors to constitute the processing circuitry 809, and executing the programs by each of the processors. In other words, each of the above-described functions may be configured as a program, and, in some cases, single processing circuitry may execute each program, or a specific function may be implemented in exclusive, independent program-execution circuitry. Each of the system control function 811 and the image generation function 813 included in the processing circuitry 809 is an example of a system controller and an image generation unit.

The term "processor" used in the above explanation indicates circuitry of, for example, a Central Processing Unit (CPU), a Graphics Processing Unit (GPU), an Application Specific Integrated Circuit (ASIC), or a Programmable Logic Device (for example, a Simple Programmable Logic Device (SPLD)), a Complex Programmable Logic Device (CPLD), and a Field. Programmable Gate Array (FPGA).

The processor realizes various types of function by reading and executing the program stored in the storage apparatus 807. Instead of storing the program on the storage apparatus 807, the program may be directly incorporated into the circuitry of the processor. In this case, the processor realizes the function by reading and executing the program incorporated into the circuitry. Similarly, the transmission circuitry 30, the reception circuitry 50, and the imaging control circuitry 70, etc. may also be configured by electronic circuitry, etc. such as the above processor.

The processing circuitry 809 comprehensively controls the MRI apparatus 1 by the system control function 811. Specifically, the processing circuitry 809 reads a system control program stored in the storage apparatus 807, develops it on the memory, and controls each circuitry, etc. of the MRI apparatus 1 in accordance with the developed system control program. For example, by the system control function 811, the processing circuitry 809 reads an imaging protocol from the storage apparatus 807 based on conditions for imaging that are input by an operator through interface 803. The processing circuitry 809 may also generate an imaging protocol based on conditions for imaging. The processing circuitry 809 transmits the imaging protocol to the imaging control circuitry 70 to control imaging with respect to the subject P.

By the image generation function 813, the processing circuitry 809 fills MR data along a readout direction in space k in accordance with a strength of the readout gradient magnetic field Gr. The processing circuitry 809 generates an MR image by performing Fourier transform on the MR data filled in space k. The processing circuitry 809 outputs the generated MR image to the display 805 and the storage apparatus 807.

In the above, the overall configuration of the MRI apparatus 1 according to the present embodiment has been explained. In the following, the RF coil apparatus 40 and the reception circuitry 50, etc. in the present embodiment will be explained.

Figure 2:
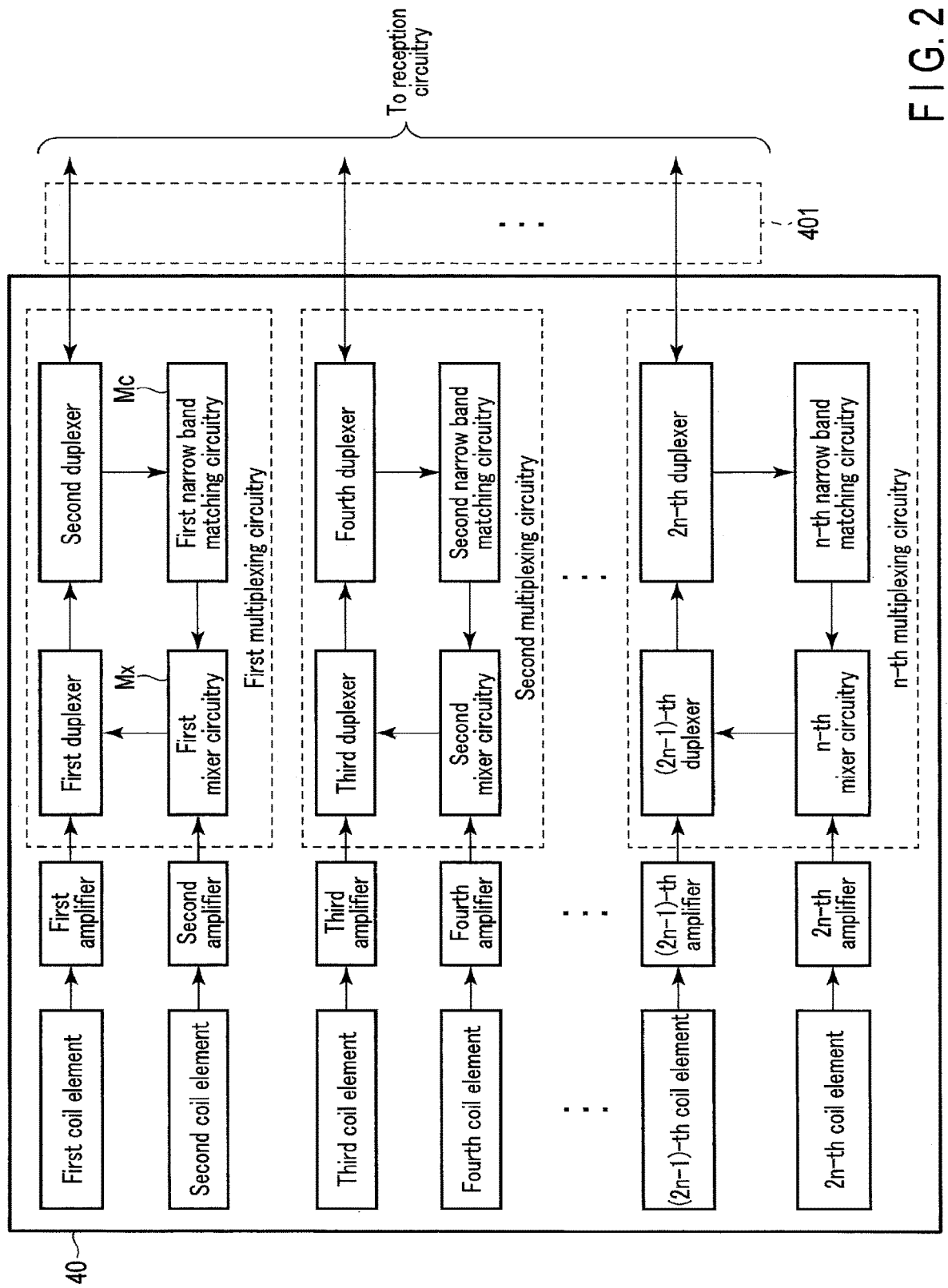
FIG. 2 shows an example of a configuration of an RF coil apparatus according to the present embodiment.

FIG. 2 shows an example of a configuration in the RF coil apparatus 40. As shown in FIG. 2, the RF coil apparatus 40 includes a plurality of coil elements, a plurality of amplifiers, and a plurality of multiplexing circuitry units. The plurality of multiplexing circuitry units may also be provided separately, between the RF coil apparatus 40 and the coaxial cable 401 shown in FIG. 1. The circuitry configuration here becomes similar to that in FIG. 2 when observing the RF coil apparatus 40 from the bed apparatus 60 side. Each of the plurality of multiplexing circuitry units includes two duplexers, mixer circuitry, and matching circuitry. Each of the plurality of multiplexing circuits multiplexes a plurality of MR signals received by each of the plurality of coil elements, by using a local signal. The mixer circuitry converts at least one frequency among the plurality of MR signals in accordance with a frequency of the local signal input via a local port. The matching circuitry is circuitry that matches, in a narrow band, the local signal with an impedance of a local port at the mixer circuitry by, for example, a Low-Pass Filter (LPF), a High-Pass Filter (HPF), a Band-Pass Filter (BPF), or a combination of these filters. In the following, narrow-band matching circuitry is used as an example of the matching circuitry. The total number of amplifiers corresponds to the total number of coil elements. The total number of multiplexing circuitry units corresponds to half the number of coil elements. In the case where the RF coil apparatus 40 functions as the transmission/reception coil apparatus, the RF pulse input from the transmission circuitry 30 via the coaxial cable 401 is output to each of the plurality of coil elements via a demultiplexer (not illustrated).

In FIG. 2, the total number of coil elements, the total number of amplifiers, and the total number of duplexers are described as 2n ("n" is a natural number). Furthermore, in FIG. 2, the total number of multiplexing circuitry units, the total number of mixer circuitry units, and the total number of narrow-band matching circuitry units are described as "n", which is half the number of 2n. 2n is, for example, 64. Here, the total number of multiplexing circuitry units becomes 64/2=32. The total number of multiplexing circuitry units may be less than "n" in accordance with, for example, the capacity of the coaxial cable 401. Here, the mixer circuitry converts at least one frequency among the plurality of MR signals in accordance with the local frequency of the local signal input via the local port.

Each of the plurality of MR signals received at the plurality of coil elements is amplified respectively at the plurality of amplifiers. Among the plurality of amplified MR signals, two are input to each of the plurality of multiplexing circuitry units. Each of the plurality of multiplexing circuitry units receives the local signal generated at the reception circuitry 50 (to be explained later on) from the reception circuitry 50 via the coaxial cable 401. Each of the plurality of multiplexing circuitry units multiplexes the two input MR signals by using the frequency of the local signal (hereinafter referred to as a "local frequency"). Each of the plurality of multiplexing circuitry units outputs the two multiplexed MR signals (hereinafter referred to as a "multiplexed signal") to the reception circuitry 50 via the coaxial cable 401.

For example, a first coil element receives a first MR signal. A first amplifier amplifies the first MR signal. The amplified first MR signal is output to first multiplexing circuitry. A second coil element receives a second MR signal. A second amplifier amplifies the second MR signal. The amplified second MR signal is output to the first multiplexing circuitry. The first multiplexing circuitry multiplexes the first MR signal and the second MR signal by using a local signal, and generates a first multiplexed signal. The first multiplexing circuitry outputs the first multiplexed signal to the reception circuitry 50 via the coaxial cable 401. Since functions in the third to 2n-th coil elements, third to 2n-th amplifiers, and second to n-th multiplexing circuitry are the same as mentioned above, explanations thereof will be omitted. The mixer circuitry and the narrow-band matching circuitry in the multiplexing circuitry shown in FIG. 2 will be explained later on.

Figure 3:
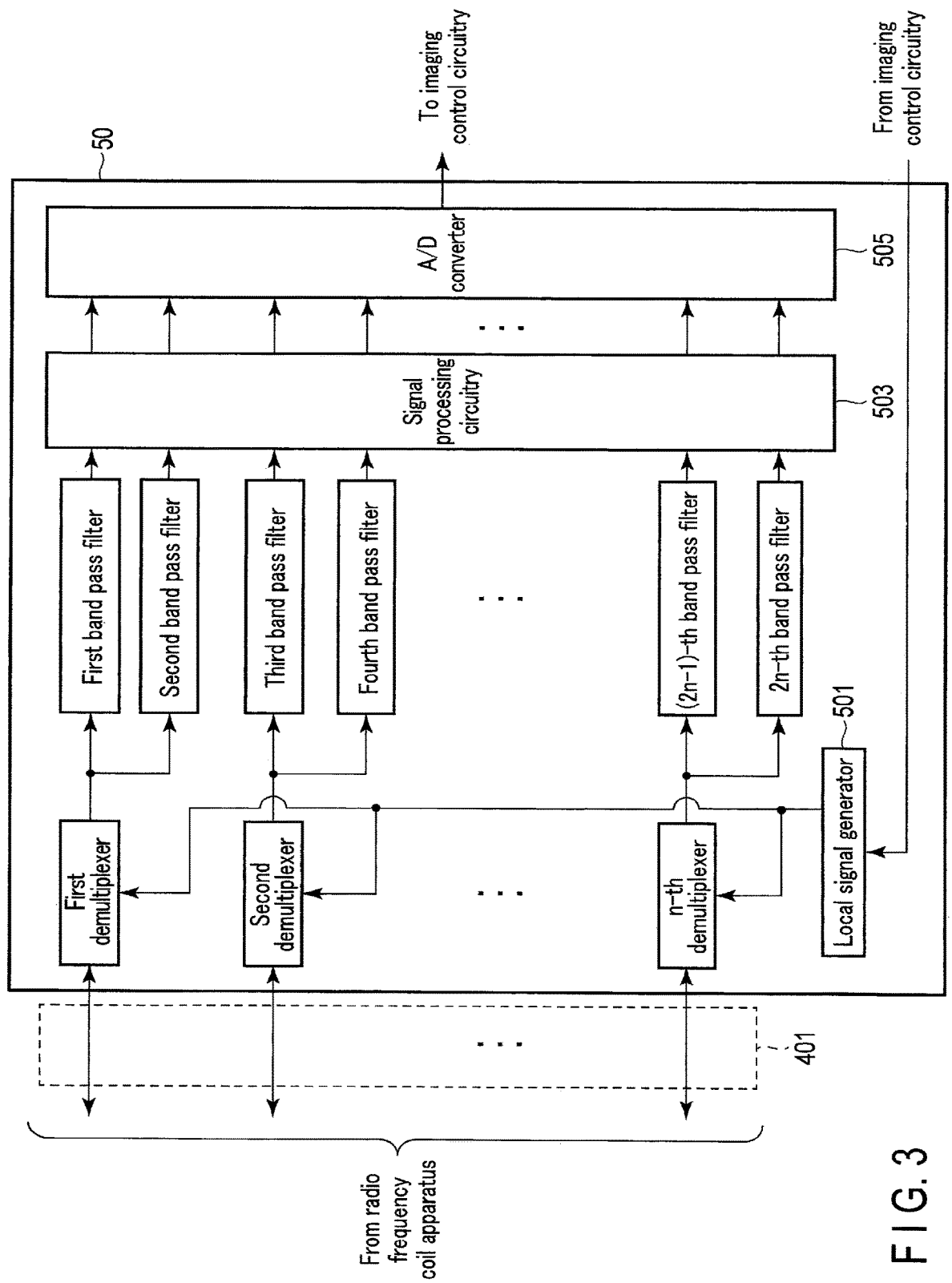
FIG. 3 shows an example of a configuration of reception circuitry according to the present embodiment.

FIG. 3 shows an example of a configuration in the reception circuitry 50. As shown in FIG. 3, the reception circuit 50 includes a plurality of demultiplexers, a plurality of band pass filters, a local signal generator 501, signal processing circuitry 503, and an A/D converter 505. The total number of demultiplexers corresponds to half the number of coil elements. The total number of band pass filters corresponds to the total number of coil elements.

The local signal generator 501 is controlled by the imaging control circuitry 70 to generate a local signal that has a local frequency. The local signal generator 501 outputs the generated local signal to the plurality of demultiplexers. Specifically, the local signal generator 501 includes an oscillator that generates the local signal. The local frequency is set by a resonance frequency defined by a static magnetic field. That is, the local signals differ depending on the strength of the static magnetic field, such as a model number of the MRI apparatus. A power level (decibel milliwatt: dBm) of the local signal generated by an oscillator (not illustrated) is a power level at which a conversion loss (power loss) for converting the frequency of the MR signal at the mixer circuitry becomes a predetermined conversion loss (hereinafter referred to as a "local power"). The predetermined conversion loss corresponds to, for example, a conversion loss which occurs when the mixer circuitry is driven using the local signal input to the mixer circuitry by a wide-band matching.

In the following, to provide detailed explanations, the local frequency will be set as 182 MHz in the case where the static magnetic field is 3 T. However, the local frequency is not limited to 182 MHz. That is, the local frequency may be any frequency on the condition that the local frequency is not included in a band that is defined by adjusting a gradient magnetic field for slice selection $G_s$ to the resonance frequency.

The local signal generator 501 may be incorporated into the RF coil apparatus 40. Here, a second duplexer would become unnecessary in the plurality of demultiplexers and the RF coil apparatus 40, and the local signal generator 501 incorporated into the RF coil apparatus 40 is connected to each of the plurality of narrow-band matching circuitry units.

Each of the demultiplexers outputs the multiplexed signals input from the RF coil apparatus 40 via the coaxial cable 401 to two band pass filters. The demultiplexers output the local signals input from the local signal generator 501 to the plurality of multiplexing circuitry units via the coaxial cable 401.

Each of the band pass filters retrieves one MR signal from the multiplexed signals. Each of the band pass filters outputs the retrieved MR signal to the signal processing circuitry 503.

The signal processing circuitry 503 executes the above-mentioned various types of signal processing with respect to each of the MR signals corresponding to the total number of coil elements. The signal processing circuitry 503 outputs the MR signals to which various types of signal processing have been executed to the A/D converter 505.

The A/D converter 505 executes A/D conversion with respect to the MR signals to which various types of signal processing have been executed. The A/D converter 505 may be provided between the demultiplexer and the band pass filter, or between the band pass filter and the signal processing circuitry 503.

Various types of constituent elements in the first multiplexing circuitry will be explained with reference to FIG. 2 to FIG. 4. As the functions of various types of constituent elements in the second to n-th multiplexing circuitry are the same as the functions of various types of constituent elements in the first multiplexing circuitry, explanations thereof will be omitted. FIG. 4 shows an example of a circuitry configuration in the first narrow-band matching circuitry Mc and the first mixer circuitry Mx.

The first MR signal amplified by the first amplifier is output from the first amplifier to the first duplexer in the first multiplexing circuitry. The second MR signal amplified by the second amplifier is output to the first mixer circuitry Mx in the first multiplexing circuitry.

The first mixer circuitry Mx has a local port Lo to which the local signal that has the local frequency is input. Generally, the local port Lo has a frequency characteristic with respect to a signal (hereinafter referred to as an input signal) input to the local port Lo. A frequency characteristic indicates dependency on impedance with respect to the frequency of an input signal, and dependency on phase change with respect to the frequency of the input signal.

A local signal matched in a narrow band with the local frequency is input to the first mixer circuitry Mx via the first narrow-band matching circuitry Mc and the first local port Lo. Furthermore, the amplified second MR signal is input to the first mixer circuitry Mx from the second amplifier. The first mixer circuitry Mx converts the frequency of the input second MR signal in accordance with the local frequency of the input local signal. Here, the first mixer circuitry Mx is driven by a local power that is smaller than in the case of a wide-band matching in which, in a wide band, a local signal to be input to the local port Lo is matched with the local frequency. In addition, the first mixer circuitry Mx is driven with a conversion loss that is equal to a conversion loss related to conversion of the frequency in the case of the wide-band matching. That is, the first mixer circuitry Mx is driven with the same efficiency as the efficiency of the mixer circuitry in the case of the wide-band matching. The first mixer circuitry Mx outputs the frequency-converted second MR signal to the first duplexer.

In the following, to provide detailed explanations, the resonance frequency will be described as 123 MHz. The value of this resonance frequency corresponds to a resonance frequency of hydrogen $^1H$ that is calculated by using a magnetogyric ratio ($\gamma \approx 42.58$ MHz/T) of hydrogen $^1H$ in the case where a central magnetic field in direction Z in a certain slice, that is, a total magnetic field of a static magnetic field (for example, 3 T) and the gradient magnetic field for slice selection $G_s$ is 2.9 T. The resonance frequency 123 MHz corresponds to the frequencies in the first MR signal and the second MR signal.

The first mixer circuitry Mx multiplies the amplified second MR signal that has 123 MHz by the local signal that has 182 MHz. The multiplied signal generated by this multiplication has two frequency components such as 305 MHz that is the sum of 182 MHz and 123 MHz, and 59 MHz that is the difference between 182 MHz and 123 MHz. A desired frequency component between these two frequency components is assumed as, for example, a low-frequency component. The desired frequency component may also be a high-frequency component between these two frequency components. Here, the first mixer circuitry extracts the low-frequency component, that is, the multiplied signal of 59 MHz, from these two frequency components by the low-pass filter, etc. The first mixer circuitry Mx outputs the extracted signal, that is, the second MR signal that has between frequency-converted to 59 MHz, as an intermediate frequency (IF) signal to the first duplexer.

The first duplexer generates the first multiplexed signal by adding the first MR signal and the second MR signal that includes an intermediate frequency. That is, the first duplexer superimposes the second MR signal on the first MR signal. Here, the first duplexer functions as superimposing circuitry. The first duplexer outputs the first multiplexed signal to the second duplexer.

The second duplexer outputs the first multiplexed signal output from the first duplexer to a first demultiplexer via the coaxial cable 401. The second duplexer outputs the local signal output from the reception circuitry 50 via the coaxial cable 401 to the first narrow-band matching circuitry Mc.

The first narrow-band matching circuitry Mc matches, in a narrow band, the local signal output from the second duplexer, that is, the local signal prior to input to the local port Lo, with the local frequency. The narrow band is a band that includes, for example, a local frequency set by a resonance frequency that is defined by a static magnetic field regarding a magnetic resonance signal, and the neighborhood of the local frequency. The narrow band may be defined by a band of plus/minus 250 kHz, with the local frequency as a central frequency. The narrow band may also be a band width regarding reception of the MR signal, the band width centering on the local frequency.

In order to realize the impedance matching and the phase matching in the narrow band in accordance with the frequency characteristic at the local port Lo, as shown in FIG. 4, the first narrow-band matching circuitry Mc is configured by a plurality of resistances (for example, resistance for matching), a plurality of coils, and a plurality of condensers. The circuit configuration shown in FIG. 4 is an example. Therefore, each of the first to n-th narrow-band matching circuitry may be configured by a circuitry configuration in which at least one of the resistances, the coils, and the condensers is connected in series or in parallel. The number of stages of the circuitry configuration in the narrow-band matching circuitry can be set as appropriate in accordance with the purpose of the narrow-band matching. Each of the first to n-th narrow-band matching circuitry is configured by a non-magnetic component operable within a static magnetic field.

According to the above-described configuration, the following advantageous effects can be obtained.

According to the MRI apparatus 1 and the RF coil apparatus 40 of the present embodiment, the local signal to be input to the local port at the mixer circuitry can be matched, in the narrow band, with the local frequency, and at least one frequency among the MR signals received respectively by the coil elements can be converted in accordance with the local frequency of the narrow-band-matched local signal. That is, according to the present embodiment, since the resonance frequency is constant for each static field strength, such as, for each model number of the MRI apparatus, the local frequency used for the frequency conversion can be limited to a narrow band.

Furthermore, according to the present embodiment, the narrow band can be defined in a band that includes the local frequency set by the resonance frequency defined by the static magnetic field and the neighborhood of the local frequency, the band of plus/minus 250 kHz centering on the local frequency, or the band width regarding the reception of the MR signal, centering on the local frequency.

According to the present embodiment, the narrow-band matching circuitry in the multiplexing circuitry can be realized by at least one of the resistance for matching, the coil, and the condenser for realizing the impedance matching and the phase matching in the narrow band in accordance with the frequency characteristic at the local port.

Therefore, according to the present embodiment, the narrow-band matching allows for a ratio of a reflection power level with respect to an input power level of the local signal with respect to the local port (S11) to become smaller than that in the case of a wide-band matching that matches, in the wide band, the local signal to be input to the mixer circuitry with the local frequency. That is, according to the present embodiment, a return loss can be reduced in comparison to the case of the wide-band matching, and the local signal can be input to the mixer circuitry more efficiently. In this manner, the mixer circuitry in the present embodiment can be driven by a local power smaller than in the case of the wide-band matching in which, in the wide band, a local signal to be input to the mixer circuitry is matched with the local frequency. Furthermore, according to the present embodiment, the local signal including the local power that drives the mixer circuitry by the conversion loss that is equal to the conversion loss regarding conversion of the frequency in the case of the wide-band matching can be input to the mixer circuitry.

For example, in a case where the local power is +10 dBm upon wide-band matching, the local power of the local signal in the present embodiment can be set to 0 dBm. That is, according to the present embodiment, the local power necessary for operating the mixer circuitry can be set to a low power of approximately 1/10 in comparison to the case of the wide-band matching. Since the heat generated at the local port depends on the magnitude of the lower power, the present embodiment is able to reduce and suppress the heat at the RF coil apparatus 40, which would enhance the safety of the subject P. Therefore, according to the present RF coil apparatus 40, an examination environment for the subject P can be improved when executing magnetic resonance imaging. Furthermore, according to the present embodiment, power consumption at the magnetic resonance imaging apparatus 1 can be suppressed.

Applied Example

The difference from the present embodiment is that a local signal is output to an RF coil apparatus 40 in a period including a reception period in which a plurality of coil elements receive MR signals.

Figure 5:
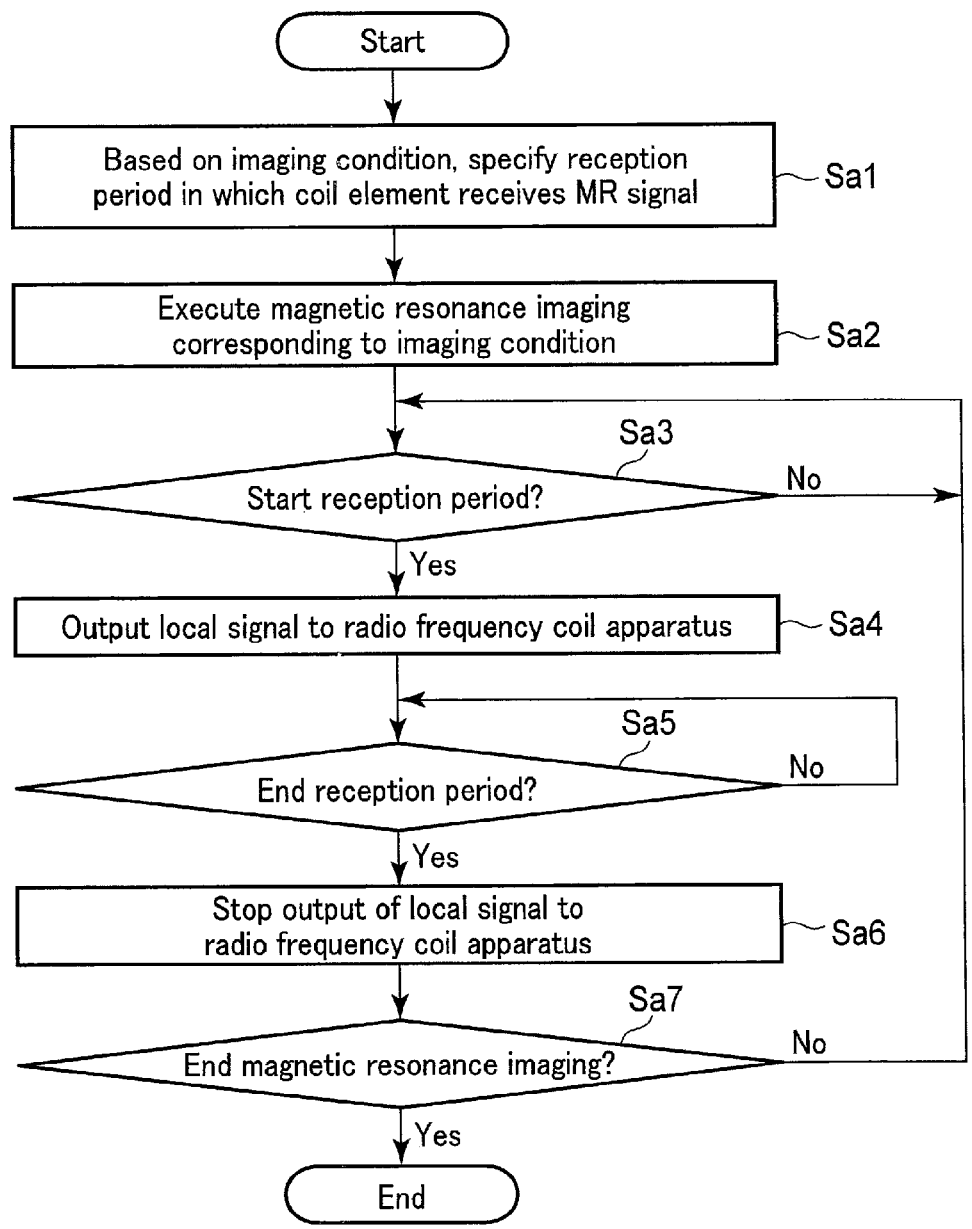
FIG. 5 is a flowchart showing an example of a processing procedure regarding a local signal control function according to an applied example of the present embodiment.

An imaging control circuitry 70 includes a local signal control function 701. The local signal control function 701 is stored in a memory or a storage apparatus 807 in the imaging control circuitry 70 in the form of a program (hereinafter referred to as a "local signal control program") that is executable by a computer. The imaging control circuitry 70 is a processor that realizes the local signal control function 701 by reading the local signal control program from its own memory or the storage apparatus 807, and executing it. That is, the imaging control circuitry 70 in a state where it has read the local signal control program includes the local signal control function 701. The local signal control function 701 that is included in the imaging control circuitry 70 is an example of a local signal controller. In the following, operations of a processing procedure regarding the local signal control function 701 will be explained with reference to FIG. 5. FIG. 5 is a flowchart showing an example of the processing procedure regarding the local signal control function 701.

(Operation)
(Step Sa1)

When an imaging condition is input and set by an instruction from an operator via an interface 803, the imaging control circuitry 70 reads the local signal control program from its own memory or the storage apparatus 807, and executes it. In this manner, the local signal control function 701 is realized. Subsequently, based on the imaging condition, the imaging control circuitry 70 specifies a reception period in which the coil elements are to receive the MR signals. The reception period corresponds to an application period of a positive readout gradient magnetic field Gr in a pulse sequence. Specifically, the imaging control circuitry 70 specifies a timing at which reception is started in the reception period (hereinafter referred to as a "start-of-reception timing"), and a timing at which reception is ended in the reception period (hereinafter referred to as an "end-of-reception timing").

Figure 6:
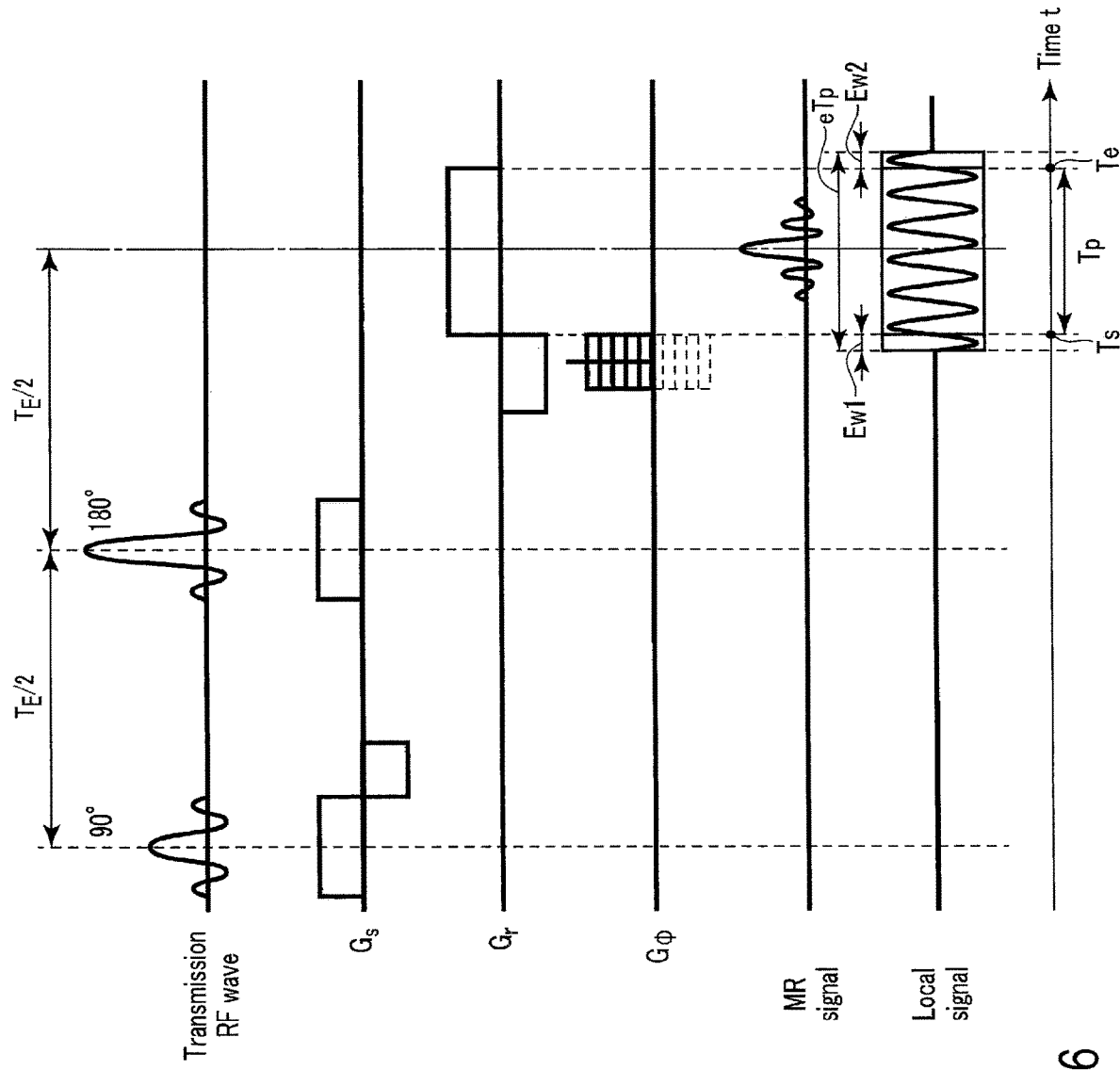
FIG. 6 shows an example of a reception period in a pulse sequence in a spin echo method, a start-of-reception timing, and an end-of-reception timing according to the applied example of the present embodiment.

FIG. 6 shows an example of the reception period, the start-of-reception timing, and the end-of-reception timing in a pulse sequence in a spin echo method. As shown in FIG. 6, a reception period Tp coincides with the application period of the positive readout gradient magnetic field Gr. A start-of-reception timing Ts corresponds to an application start time of the positive readout gradient magnetic field Gr. An end-of-reception timing Te corresponds to an application end time of the positive readout gradient magnetic field Gr. A central time of the reception period Tp corresponds to a time at which an echo time TE has passed from a center of an irradiation interval of a transmission RF wave applied to the subject P.

In the following, in order to provide detailed explanations, a pulse sequence executed in a magnetic resonance imaging will be regarded as the pulse sequence shown in FIG. 6. The pulse sequence applicable in the present applied example is not limited to the pulse sequence shown in FIG. 6, and can be applied to any pulse sequence.

(Step Sa2)

In accordance with an instruction from the operator via the interface 803, the imaging control circuitry 70 executes a magnetic resonance imaging that corresponds to the imaging condition. The imaging control circuitry 70 controls a gradient magnetic field power supply 20, transmission circuitry 30, and reception circuitry 50, etc. so as to execute, for example, the sequence shown in FIG. 6, and performs imaging of the subject P.

(Step Sa3)

The imaging control circuitry 70 determines whether or not the reception period Tp is to be started during the execution of the magnetic resonance imaging. When the reception period Tp is started during execution of the magnetic resonance imaging (step Sa3, Yes), the processing in step Sa4 is executed. That is, in response to a time t during the execution of the magnetic resonance imagining reaching the start-of-reception timing Ts, the imaging control circuitry 70 executes the processing of step Sa4.

In other words, during the execution of the magnetic resonance imaging, the imaging control circuitry 70 repeats the processing of step Sa3 until the reception period Tp is started, that is, until the time t reaches the start-of-reception timing Ts (step Sa3, No). Here, since the local signal is not generated, a local port does not generate heat.

(Step Sa4)

In the reception period Tp, the imaging control circuitry 70 outputs the local signal to the RF coil apparatus 40. Specifically, the start-of-reception timing Ts serves as a trigger for the imaging control circuitry 70 to control an oscillator in a local signal generator 501 to generate the local signal. Such control causes the oscillator to generate the local signal over the reception period Tp. The local signal generator 501 outputs the generated local signal to the RF coil apparatus 40.

(Step Sa5)

The imaging control circuitry 70 determines whether or not the reception period Tp is to be ended during the execution of the magnetic resonance imaging. When the reception period Tp is ended during execution of the magnetic resonance imaging (step Sa5, Yes), the processing of step Sa6 is executed. That is, in response to the time t during the execution of the magnetic resonance imagining reaching the end-of-reception timing Te, the imaging control circuitry 70 executes the processing of step Sa6. In other words, during the execution of the magnetic resonance imaging, the imaging control circuitry 70 repeats the processing of step Say until the reception period Tp is ended, that is, until the time t reaches the end-of-reception timing Te (step Say, No).

(Step Sa6)

The imaging control circuitry 70 stops the output of the local signal to the RF coil apparatus 40. That is, in a non-reception period, in which a plurality of coil elements do not receive the MR signals, the imaging control circuitry 70 suspends transmission of the local signals. Specifically, the end-of-reception timing Te serves as a trigger for the imaging control circuitry 70 to control the oscillator to stop the local signal. Thereafter the end-of-reception timing Te, the oscillator is controlled to stop generation of the local signal until the time the time t becomes a new start-of-reception timing Ts.

(Step Sa7)

The imaging control circuitry 70 repeats the processing of steps Sa3 to Sa7 until the magnetic resonance imaging is ended (Step Sa7, No).

In the processing of steps Sa4 and Sa6, the imaging control circuitry 70 controls whether or not to output the local signal to the RF coil apparatus 40 by controlling ON/OFF of the operation of the oscillator; however, in the present applied example, this is not limited to the ON/OFF control of the operation of the oscillator.

As a modified example of the present applied example, a local signal generator 501 has, for example, a switch to switch a signal line ON/OFF (hereinafter referred to as a "local signal transmission line") on which local signals are transmitted from the local signal generator 501 to a plurality of demultiplexers; that is, a switch that is provided between an oscillator and the local signal transmission line. Here, the oscillator in the local signal generator 501 generates local signals at all times. The imaging control circuitry 70 controls the ON/OFF functions of the switch by a local signal control function 701. Specifically, in the processing of step Sa4, by turning on the switch provided in a latter stage of the oscillator in a reception period Tp, the imaging control circuitry 70 outputs the local signals from the local signal generator 501 to an RF coil apparatus 40. Furthermore, in the processing of step Sa6, by turning off the switch in a non-reception period, the imaging control circuitry 70 cuts off supply of the local signals from the local signal generator 501 to the RF coil apparatus 40.

A period of generating the local signals (hereinafter referred to as a "local signal generation period"), or a period of outputting the local signals to the RF coil apparatus 40 (hereinafter referred to as a "local signal output period") is not limited to a reception period Tp of MR signals. For example, by the local signal control function 701, the imaging control circuitry 70 may set the local signal generation period or the local signal output period in an extended manner so as to include the reception period Tp. A period eTp in FIG. 6 indicates an extended local signal generation period. As shown in FIG. 6, a first extension width Ew1 and a second extension width Ew2 of the local signal generation period are preset, and stored in, for example, a memory or a storage apparatus 807 in the imaging control circuitry 70. The first extension width Ew1 and the second extension width Ew2 may respectively have different time widths, or the same time width. The first extension width Ew1 and the second extension width Ew2 can be set/changed by, for example, an instruction from an operator.

The imaging control circuitry 70 sets a point of time that extends back from a start-of-reception timing Ts by the first extension width Ew1 as a starting point of time of the local signal generation period, or a starting point of time of the local signal output period. The imaging control circuitry 70 sets a point of time that has passed an end-of-reception timing Te by the second extension width Ew2 as an ending point of time of the local signal generation period, or an ending point of time of the local signal output period. The imaging control circuitry 70 controls the oscillator in the local signal generator 501 to generate local signals over the extended local signal generation period eTp. The imaging control circuitry 70 also outputs the local signals from the local signal generator 501 to the RF coil apparatus 40 by turning on the switch over the extended local signal output period. According to the present modified example, stable local signals can be output without fail to the RF coil apparatus 40 over the reception period Tp.

As a modified example of the present applied example, when a pulse sequence is set, in which a plurality of MR signals are multiplexed using the local signals (hereinafter referred to as a "multiplex applying sequence"), local signals may be generated at the starting point of time of the multiplex applying sequence, and transmission of the local signals may be suspended at the ending point of time of the multiplex applying sequence. Specifically, the imaging control circuitry 70 sets the multiplex applying sequence based on, for example, an instruction from an operator via an interface 803, or a connection between an RF coil apparatus 40 and a connection port 605 serving as a trigger. When the multiplex applying sequence is set, the imaging control circuitry 70 controls the oscillator in the local signal generator 501 by the local signal control function 701 in order to generate local signals at the starting point of time of the multiplex applying sequence. The imaging control circuitry 70 controls the oscillator in the local signal generator 501 to suspend transmission of the local signals at the ending point of time of the multiplex applying sequence.

Figure 7:
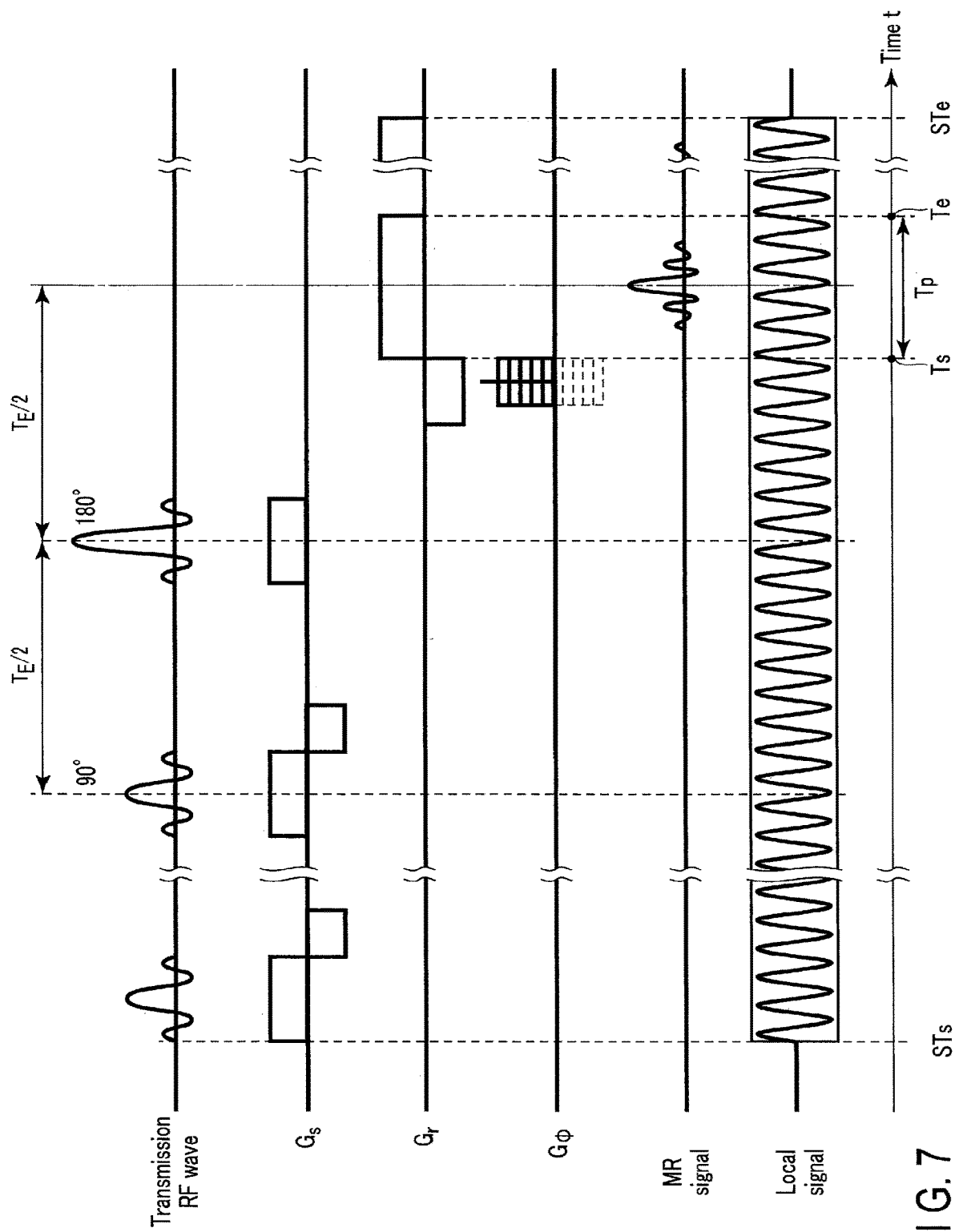
FIG. 7 shows an example of a starting point of the time of a sequence in which multiplexing is applied, an ending point of the time of a sequence in which multiplexing is applied, and an output period of a local signal to the RF coil apparatus in a sequence in which multiplexing is applied according to the applied example of the present embodiment

FIG. 7 shows an example of a starting point of time STs of the multiplex applying sequence, an ending point of time STe of the multiplex applying sequence, and an output period of local signals to the RF coil apparatus 40 in the multiplex applying sequence according to the present modified example. As shown in FIG. 7, the local signals are output to the RF coil apparatus 40 over an execution period of the multiplex applying sequence. Therefore, according to the present modified example, stable local signals can be output without fail to the RF coil apparatus 40 over the reception period Tp when executing the multiplex applying sequence.

According to the configuration mentioned above, in addition to the advantageous effects in the present embodiment, the following advantageous effects may be obtained.

According to the MRI apparatus 1 of the present embodiment, the reception period in which the coil elements receive the MR signals is specified based on the imaging conditions, and the local signals can be output to the RF coil apparatus 40 in the specified reception period. Therefore, since the local signals are supplied to the mixer circuitry only when receiving the MR signals (that is, since transmission of local signals is stopped in a period that does not receive the RF signals), the local power consumed at the local port of the mixer circuitry can be further reduced. Thus, according to the present applied example, the heat generated at the RF coil apparatus 40 can be further reduced and further suppressed, and the safety of the subject P can be further enhanced.

According to the MRI apparatus 1 and the RF coil apparatus 40 of the embodiment and the applied example, etc. mentioned above, the heat generated at the RF coil apparatus can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An RF coil apparatus comprising:
a plurality of coil elements, each receiving a plurality of magnetic resonance signals; and
multiplexing circuitry configured to multiplex the plurality of magnetic resonance signals received respectively by the plurality of coil elements, by using a local signal,
wherein the multiplexing circuitry comprises
mixer circuitry including a local port to input the local signal including a local frequency, and configured to convert at least one frequency among the plurality of magnetic resonance signals in accordance with the local frequency of the local signal input via the local port, and
matching circuitry configured to match, in a narrow band, a local signal to be input to the local port with the local frequency.

2. The RF coil apparatus according to claim 1, wherein the narrow band is defined as a band including: the local frequency set by a resonance frequency that is defined by a static magnetic field; and a neighborhood of the local frequency.

3. The RF coil apparatus according to claim 1, wherein the narrow band is defined by a band of plus/minus 250 kHz, with the local frequency as a central frequency.

4. The RF coil apparatus according to claim 1, wherein the narrow band is a band width regarding reception of the magnetic resonance signal, the band width centering on the local frequency.

5. The RF coil apparatus according to claim 1, wherein the matching circuitry
comprises at least one of a resistance, a coil, and a condenser for realizing impedance matching and phase matching at the narrow band in accordance with a frequency characteristic at the local port, and
is configured operable within a static magnetic field.

6. The RF coil apparatus according to claim 1, wherein the mixer circuitry
is driven by a smaller local power than in the case of a wide-band matching in which, in a wide band, the local signal to be input is matched with the local frequency, and
is driven with a conversion loss that is equal to a conversion loss related to conversion of the frequency in the case of the wide-band matching.

7. A magnetic resonance imaging apparatus comprising an RF coil apparatus comprising a plurality of coil elements that respectively receives a plurality of magnetic resonance signals, and multiplexing circuitry configured to multiplex the plurality of magnetic resonance signals received respectively by the plurality of coil elements, by using a local signal,
wherein the multiplexing circuitry comprises
mixer circuitry including a local port to input the local signal including a local frequency, and configured to convert at least one frequency among the plurality of magnetic resonance signals in accordance with the local frequency of the local signal input via the local port, and
matching circuitry configured to match, in a narrow band, a local signal to be input to the local port with the local frequency.

8. The magnetic resonance imaging apparatus according to claim 7, wherein the narrow band is defined as a band including: the local frequency set by a resonance frequency that is defined by a static magnetic field; and a neighborhood of the local frequency.

9. The magnetic resonance imaging apparatus according to claim 7, wherein the narrow band is defined by a band of plus/minus 250 kHz, with the local frequency as a central frequency.

10. The magnetic resonance imaging apparatus according to claim 7, wherein the narrow band is a band width regarding reception of the magnetic resonance signal, the band width centering on the local frequency.

11. The magnetic resonance imaging apparatus according to claim 7, wherein the matching circuitry
comprises at least one of a plurality of resistances, a plurality of coils, and a plurality of condensers for realizing impedance matching and phase matching at the narrow band in accordance with a frequency characteristic at the local port, and
is configured operable inside a static magnetic field.

12. The magnetic resonance imaging apparatus according to claim 7, wherein the mixer circuitry
is driven by a smaller local power than that in a case of a wide-band matching in which, in a wide band, the local signal to be input is matched with the local frequency, and
is driven with a conversion loss that is equal to a conversion loss related to conversion of the frequency in the case of the wide-band matching.

13. The magnetic resonance imaging apparatus according to claim 7, further comprising imaging control circuitry configured to specify a reception period in which the coil elements receive the magnetic resonance signals based on an imaging condition, and configured to output the local signals to the RF coil apparatus in the reception period.

* * * * *